(12) United States Patent
Lesso et al.

(10) Patent No.: US 11,418,153 B2
(45) Date of Patent: Aug. 16, 2022

(54) AMPLIFIER CIRCUITS

(71) Applicant: Cirrus Logic International Semiconductor Ltd., Edinburgh (GB)

(72) Inventors: John P. Lesso, Edinburgh (GB); Andrew J. Howlett, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 103 days.

(21) Appl. No.: 16/897,847

(22) Filed: Jun. 10, 2020

(65) Prior Publication Data

US 2021/0391831 A1  Dec. 16, 2021

(51) Int. Cl.

| | |
|---|---|
| *H03F 3/217* | (2006.01) |
| *H03F 1/32* | (2006.01) |
| *H03F 3/45* | (2006.01) |
| *H03G 3/30* | (2006.01) |

(52) U.S. Cl.
CPC ........... *H03F 1/3211* (2013.01); *H03F 3/217* (2013.01); *H03F 3/45475* (2013.01); *H03G 3/3005* (2013.01); *H03F 2200/03* (2013.01); *H03F 2200/129* (2013.01)

(58) Field of Classification Search
CPC .... H03F 1/3211; H03F 3/217; H03F 3/45475; H03F 2200/03; H03F 2200/129; H03G 3/3005
USPC .............................. 330/136, 207 A, 251, 306
See application file for complete search history.

(56) References Cited

U.S. PATENT DOCUMENTS

| 8,093,951 B1* | 1/2012 | Zhang | H03F 3/217 |
| | | | 330/251 |
| 9,473,087 B2* | 10/2016 | Lesso | H03F 1/0211 |
| 10,171,049 B2* | 1/2019 | Lesso | H03F 3/217 |
| 2015/0222237 A1 | 8/2015 | Cotton | |

OTHER PUBLICATIONS

Combined Search and Examination Report under Sections 17 and 18(3), UKIPO, Application No. GB2106963.8, dated Nov. 16, 2021.

* cited by examiner

*Primary Examiner* — Khanh V Nguyen
(74) *Attorney, Agent, or Firm* — Jackson Walker L.L.P.

(57) ABSTRACT

This application relates to amplifier circuitry and, in particular, to class-D amplifier circuits. The application describes amplifier circuitry (400) for receiving an input signal (Sin) and generating first and second driving signals (SoutP, SoutN) for driving a bridge-tied-load. The amplifier circuitry includes first and second class-D output stages (403*p*, 403*n*) for generating the first and second driving signals based on the input signal. A controller (406) controllably varies a common-mode component of the first and second driving signals based on an indication of amplitude of the first and second driving signals. The controller varies the common-mode component, at lower signal amplitudes, so the common-mode level of the first and second driving signals is moved away from an operating region that leads to distortion.

17 Claims, 4 Drawing Sheets

AMPLIFIER CIRCUITS

TECHNICAL FIELD

The field of representative embodiments of this disclosure relates to methods, apparatus and/or implementations concerning or relating to amplifier circuits, in particular to Class D amplifiers.

BACKGROUND

Class D amplifiers, sometimes known as switched-mode amplifiers or drivers, are a known type of amplifier in which an output stage includes a plurality of switches for selectively connecting an output node to one of a plurality of defined voltages. The switches of the output stage are controlled to connect the output node to the different voltages so that the average voltage at the output node, over time, has the desired value.

FIG. 1 illustrates one example of a class D amplifier circuit 100 for receiving an input signal Sin and generating an output signal Sout for driving a load (not illustrated). The class D amplifier includes a switching stage 101, which, in this example, comprises high-side and low-side switches MH and ML for selectively connecting an output node 102 to a high-side voltage VH or a low-side voltage VL respectively, for example a positive supply voltage and ground, or supply voltages of equal and opposite magnitude. The switches are controlled by a switch pre-driver 103, based, in this example, on a PWM signal Spwm generated by PWM modulator 104. The PWM modulator 104 receives the input signal Sin and generates the PWM signal Spwm with a duty-cycle that depends on the value of the input signal.

The output signal Sout, is thus a signal which varies between the two voltages VH and VL with a duty-cycle that varies with that of the PWM signal Spwm, and hence the input signal. The average voltage of the output signal Sout at the output node 102, over the course of a PWM cycle, thus depends on the duty cycle of the PWM signal and hence the value of the input signal. In some implementations an output filter (not illustrated in FIG. 1) may be arranged, either as part of the class D amplifier circuit 100 or as a separate downstream filter, to apply filtering to the output signal Sout to provide an analogue output signal Sout, although in some embodiments at least part of the filtering may be provided by a load driven by the output signal.

It will be understood that, to avoid an unwanted and potentially damaging shoot-through current, both the high-side and the low-side switches should not be on (i.e. conducting or open) simultaneously. As the switches, which typically are implemented by transistors, may take some time to fully turn-off during a switch transition, the switch pre-driver 103 is generally configured to operate in a 'break-before-make' manner and thus operates to initiate turn-off of the currently active switch before initiating turn-on of the other switch.

FIG. 2 illustrates this approach. FIG. 2 illustrates the PWM signal Spwm, and the switch control signals SH and SL for controlling the high-side and the low-side switches MH and ML respectively, in an example where the relevant control signal SH or SL goes high to turn the relevant switch on and goes low to turn the relevant switch off. FIG. 2 illustrates that, initially, the PWM signal is high and the high-side switch is on and the low-side switch is off. At a time t1, the PWM signal goes low and at this point the control signal SH also transitions, to turn the high-side switch off, but the control signal SL remains low, to keep the low-side switch off, and only transitions to turn the low-side switch on a short while later, at a time t2. Thus there is a short period D1, which represents a so-called 'dead time' where neither switch is actively controlled to be on. Likewise at a time t3, the PWM signal goes high again, and the switch control signal SL transitions to turn off the low side switch at this point, but the high-side switch is only turned on at a later time t4, so there is another dead-time period D2.

Such a 'break-before-make' approach, with dead-times D1 and D2, can result in distortion in the output signal. As will be understood by one skilled in the art, at any switch transition when the presently active switch is turned off, there may be current flowing to or from the load. Such current flow may not instantly cease, but may continue during the dead time, with a reducing magnitude, via a diode associated with one of the switches, e.g. an inherent body diode of the transistor switch. Such diode conduction can drive the output node to a high or low voltage depending on the direction of current flow. However, if the current magnitude reduces to zero during the dead-time, the polarity of current flow will not reverse from such diode conduction and thus the output node will be left floating. The result is that the dead time and associated diode conduction results in a distortion in transfer characteristic of the amplifier, effectively a gain that varies over at least one operating region or output signal level band of the amplifier. Such distortion is sometimes referred to as zero crossing distortion (ZCD).

FIG. 3a illustrates an example of a time domain waveform representing the output signal Sout for a class D amplifier such as discussed with reference to FIG. 1, where the input signal Sin represents a sine wave. FIG. 3a illustrates the average voltage of the output signal Sout, e.g. the average voltage across the PWM cycle period, and thus represents the filtered analogue signal as experienced by the load, normalised in a range of 0 to 1. It can be seen that the zero crossing distortion results in distortion in the output signal Sout. This distortion, as discussed above, occurs at signal levels where the current reaches zero during the dead time. For this example, distortion 300 can be seen around two distinct signal levels, on either side of the normalised quiescent signal level of 0.5. In this example the distortion occurs within an operating region 301 of the output signal Sout.

FIG. 3b illustrates an example transfer characteristic of an amplifier. FIG. 3b illustrates the voltage of the input signal Sin, in this case normalised in the range of 0 to 1, and the resulting average output voltage of the output signal Sout. It can be seen that this transfer characteristic exhibits a distortion in an operating region 301 around 0.5V, which in this example corresponds to a quiescent signal level.

Such dead time or zero crossing distortion can thus result in unwanted distortion in the output signal Sout. As this distortion may be experienced even for relatively low amplitude signals, this means that THD (total harmonic distortion) of the amplifier only improves slowly with signal, and the zero crossing distortion can give rise to a series of harmonics that can result in listener fatigue in audio applications.

The dead time periods, D1 and D2, which may or may not be the same duration as one another, are thus generally kept as short as possible to minimise the amount of any zero crossing distortion. However, the dead time periods need to be sufficiently long to allow for a relevant switch to turn off in all expected operating conditions, allowing for part-to-part variations in manufacturing processes, so there is a limit to how short the dead time periods may be in practice and hence there will be expected to be at least some dead time distortion. Closed loop operation of the class D amplifier, where feedback from the output node is used to determine and correct for errors between the output signal Sout and input signal Sin, may suppress some of the dead time distortion but there may be at least some distortion even in closed loop operation, and for open loop amplifiers there is no suppression and the dead time distortion can be one of the major sources of distortion.

SUMMARY

Embodiments of the present disclosure relate to amplifier circuitry and methods that at least mitigate at least some of the above mentioned issues.

According to an aspect of the disclosure there is provided amplifier circuitry for receiving an input signal and generating first and second driving signals for driving a bridge-tied-load, the amplifier circuitry comprising:
first and second class-D output stages for generating the first and second driving signals based on the input signal; and
a controller configured to controllably vary a common-mode component of the first and second driving signals based on an indication of amplitude of the first and second driving signals.

The controller may be configured to vary the common-mode component of the first and second driving signals, so that, for lower amplitudes of the first and second driving signals, the common-mode component corresponds to a signal level that is further away from an output signal range of the first and second output stages that experiences zero crossing distortion, than for higher amplitudes of the first and second driving signals.

In some implementations, the controller may be configured to vary the common-mode component of the first and second driving signals so that, for first and second driving signals below a first amplitude threshold, the first and second driving signals are generated in a range of signal levels that is outside an output signal range of the output stages that experiences zero crossing distortion.

In some examples the controller may be configured to monitor the input signal to provide the indication of amplitude of the first and second driving signals. The controller may comprise an envelope detector to determine an amplitude envelope value of the input signal. The controller may be configured to monitor the input signal upstream of an element which provides some signal path propagation delay.

In some examples the amplifier circuitry comprises: first and second signal paths for supplying differential signals based on the input signal to the first and second output stages respectively. The controller may be configured to controllably vary the common-mode component of the first and second driving signals by controlling the amount of an offset applied to both the first and second signal paths. In some examples the first and second signal paths may comprise respective first and second digital processing elements operable to add a digital offset to digital signals in the respective signal path. The controller may be configured to control the digital offset applied by the first and second digital processing elements. In some examples the first and second signal paths may comprise respective first and second digital-to-analogue converters. The controller may be configured to control an analogue offset applied by the first and second digital-to-analogue converters.

In some examples the controller may be configured to control operation of the first and second output stages to vary a common-mode component of the first and second driving signals. In some implementations each of the first and second output stages may comprise a respective PWM modulator for receiving a respective differential signal based on the input signal. The controller may be configured to controllably vary a reference voltage combined with the relevant differential signal input to the PWM modulator.

In some examples the controller may be configured to vary a common-mode component of the first and second driving signals by varying a voltage reference used by the amplifier circuitry to define a common-mode voltage for the first and second driving signals. The controller may be configured to control a voltage generator to generate the voltage reference. The voltage generator may a voltage digital-to-analogue converter, a current digital-to-analogue converter for driving current through a defined resistance, and/or a programmable gain element for applying a controlled gain to a defined voltage.

In some examples the controller may be configured to controllably vary the common-mode component of the first and second driving signals so that the rate of change of the common-mode component does not exceed a predefined maximum.

The amplifier circuitry may be configured to receive an audio signal as the input signal and to generate the first and second driving signals for driving an audio output transducer.

The amplifier circuitry may be implemented as an integrated circuit.

An aspect also relates to an electronic device comprising the amplifier circuitry of any of the embodiments described herein.

In another aspect there is provided amplifier circuitry comprising:
first and second output stages for generating first and second differential driving signals based on an input signal; and
a controller configured to controllably vary a common-mode component of the first and second differential driving signals depending on the amplitude of the input signal.

The controller may be configured to vary the common-mode component of the first and second differential driving signals, so that, for lower amplitudes of the input signal, said common-mode component corresponds to a signal level that is further away from an output signal range that experiences distortion, than for higher amplitudes of the first and second driving signals.

In another aspect there is provided amplifier circuitry comprising:
a differential class D output stage for generating first and second differential driving signals based on an input signal; and
a controller configured to control a common-mode component of the first and second differential driving signals so that for lower amplitudes of the first and second driving signals, said common-mode component corresponds to a signal level that is further away from an output signal range of the first and second output stages that experiences zero crossing distortion, than for higher amplitudes of the first and second driving signals.

Unless expressly indicated to the contrary, any of the various features of the various implementations discussed herein may be implemented together with any one or more of the other described features in any and all suitable combinations.

BRIEF DESCRIPTION OF DRAWINGS

For a better understanding of examples of the present disclosure, and to show more clearly how the examples may be carried into effect, reference will now be made, by way of example only, to the following drawings in which.

DETAILED DESCRIPTION OF EMBODIMENTS

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the present disclosure relates to amplifier circuit and method for driving a load in a bridge-tied load (BTL) arrangement, i.e. with differential driving signals.

Figure 4:
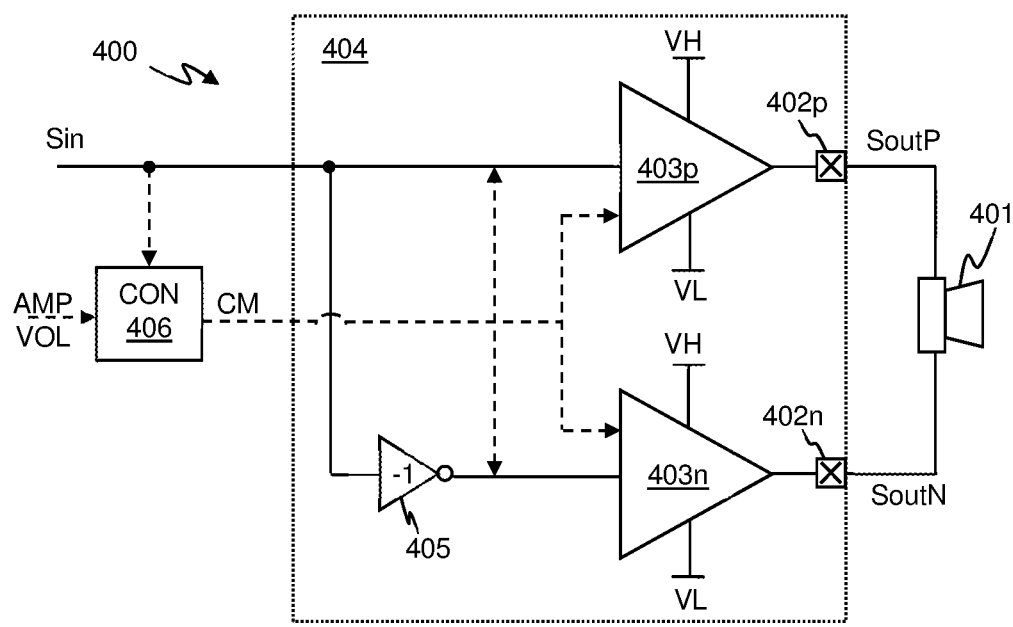
FIG. 4 illustrates an amplifier circuit according to an embodiment.

FIG. 4 illustrates an amplifier circuit 400 for driving a load 401 in a bridge-tied load arrangement. As will be understood by one skilled in the art, in a bridge-tied-load arrangement, both sides of the load 401 are driven with driving signals so as to drive a desired voltage across the load. FIG. 4 thus illustrates that the load 401 is coupled between load terminals 402p and 402n which are driven by respective amplifier output stages 403p and 403n with driving signals SoutP and SoutN. The amplifier output stages 403p and 403n can be seen as part of a differential-output amplifier 404.

FIG. 4 illustrates a configuration where the input signal Sin is received and supplied to the output stage 403p, and an inverse of the input signal, generated by inverter 405, is supplied to the output stage 403n. In such a configuration, each amplifier output stage 403p and 403n (which may be referred to herein collectively or individually by the reference 403) may comprise a class D amplifier, such as the class D amplifier 100 illustrated in FIG. 1. It will be understood, however, that in some embodiments the output stages 403p and 403n could comprise just a respective switching stage 101 and pre-driver 103, and the PWM signals supplied to the switch pre-driver 103 of each respective output stage 403 could be derived from a shared PWM modulator. It will also be understood that the differential amplifier 404 could, in practice, comprise other components in the common signal path, or in the respective differential signal paths, but such components have been omitted from FIG. 4 for clarity.

Figure 1:
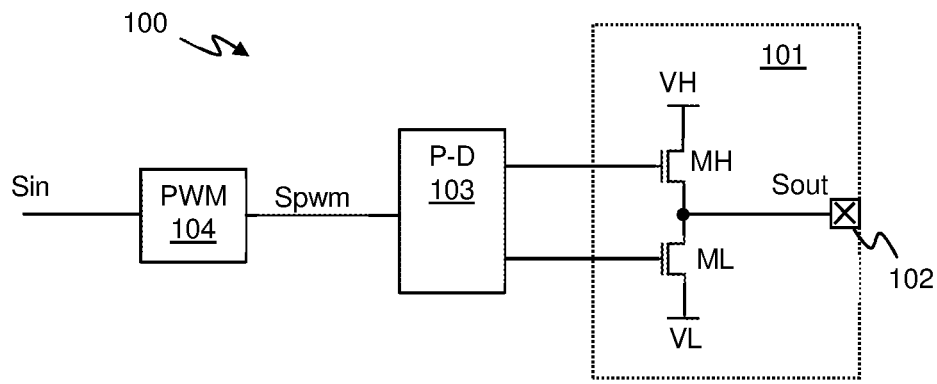
FIG. 1 illustrates an example of a class D amplifier.
Figure 2:
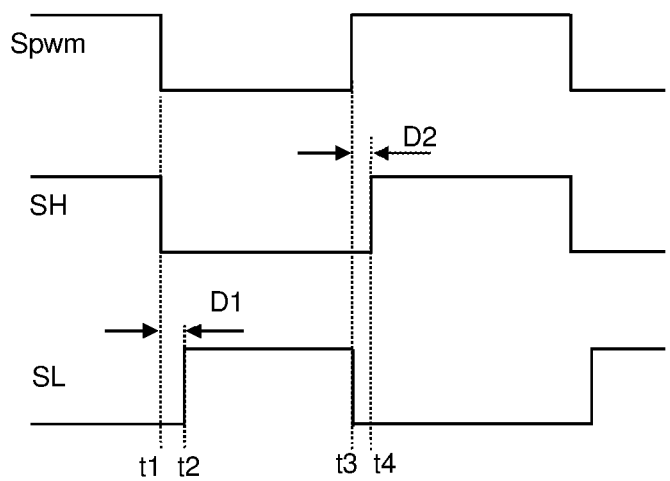
FIG. 2 illustrates the principle of dead time in switching of a class D amplifier.

Each of the output stages 403p and 403n thus switches its output node between a high-side voltage VH and a low side voltage VL as discussed with reference to FIG. 1. It will be understood that the terms high-side and low-side simply refer to voltages that are more positive/less negative than one another and do not imply anything about absolute or relative magnitudes of these voltages. In some instances the high-side and low-side voltages may be of the same magnitude as one another but different polarity. In other examples the high-side voltage could be a positive supply voltage and the low-side voltage could be ground, although other arrangements are possible. In any case, the individual output stages 403p and 403n may operate around a quiescent voltage level of Vmid, midway between VH and VL. The bridge-tied-load configuration of FIG. 4 means that the output stages 403p and 403n can together develop positive and negative voltages across the load.

Figure 5:
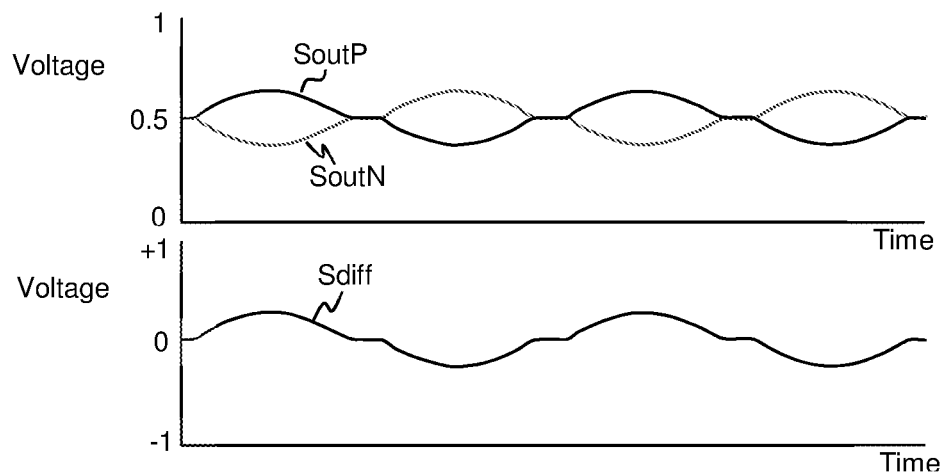
FIG. 5 illustrates output waveforms for a differential output amplifier that experiences zero crossing distortion with a common-mode set at a midpoint voltage.

As noted above, zero crossing distortion may affect the driving signal output from the output stages 403p and 403n. FIG. 5 illustrates time domain waveforms illustrating the respective output signals SoutP and SoutN corresponding to an input signal Sin that represents a sine wave. The top plot of FIG. 5 shows waveforms corresponding to the average voltage of the relevant output signals SoutP and SoutN, e.g. the average voltage across the PWM cycle period, and thus represents the filtered analogue signal as experienced by the load, normalised in a range of 0 to 1. FIG. 5 also shows a waveform of the resulting difference signal Sdiff across the load, in the normalised range of −1 to +1.

It can be seen that the zero crossing distortion results in a distortion of each of the component driving signals SoutP and SoutN and a corresponding distortion in the resulting differential voltage waveform across the load, which will be present even for signals at relatively low amplitudes. In the example of FIG. 5, the distortion can be seen around a signal level of about 0.5, although as discussed with respect to FIG. 3a the distortion may occur at output signal levels above and below the quiescent signal level that result in discontinuous current in the dead-time.

In embodiments of the present disclosure, an amplifier circuit for driving a bridge-tied-load with first and second driving signals is operable so that a common-mode component of the first and second driving signals is selectively variable. The common-mode component of the first and second driving signals is variable so as to reduce distortion in the first and second driving signals, and in particular to reduce zero-crossing distortion or dead-time distortion. The variation or modulation of the common-mode component may effectively move the level of both the first and second driving signals together, so as to reduce the extent to which the first and second driving signals experience zero cross distortion, i.e. to move the first and second driving signals to a voltage range of the amplifier circuit that suffers less from zero crossing distortion. The common-mode component of the first and second driving signals may be varied based on an indication of the amplitude of the driving signals, i.e. the signals being generated. The amount by which the common-mode component can be moved, without clipping, depends on the signal amplitude of the signals being generated. The indication of signal amplitude of the driving signals may be based on the amplitude of the input signal.

Referring back to FIG. 4, the amplifier circuit 400 according to an embodiment thus includes a controller 406 for controllably varying a common-mode component of the driving signals SoutP and SoutN, i.e. the common-mode voltage or signal level of the differential-output amplifier 404, so as improve distortion performance.

Embodiments of the present disclosure rely on the fact that, for a bridge-tied-load driven by first and second driving signals, e.g. the output driving signals SoutP and SoutN, any common-mode component of the driving signals is not experienced by the load. Thus, the driving signals SoutP and SoutN may vary around any chosen common-mode signal level and still provide the desired differential output signal, provided that there is sufficient headroom for the signal amplitude.

Conventionally the two driving signals would be generated so that a quiescent signal level corresponds substantially to Vmid, i.e. a midpoint voltage between the defined voltages VH and VL. This provides substantially symmetric headroom for the relevant driving signal to vary positively up to VH and negatively down to VL. However, as noted with respect to FIG. 3a and FIG. 5, this conventional approach would mean that the driving signals SoutP and SoutN experience zero crossing distortion at instantaneous signal levels around the midpoint voltage Vmid. Embodiments of the present disclosure make use of the fact that, for relatively low driving signal amplitudes, the common-mode level can be varied away from an operating region that leads to zero crossing distortion, e.g. away from the midpoint voltage, whilst still providing sufficient headroom for that signal amplitude. This can reduce effect of zero cross distortion on the driving signals and hence the distortion of the differential output signal.

Figure 6:
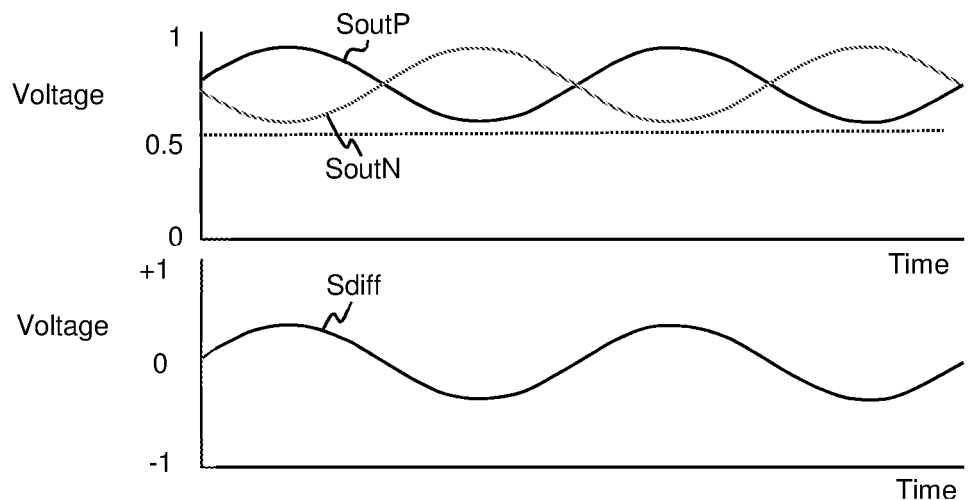
FIG. 6 illustrates output waveforms similar to FIG. 5 but with a common-mode varied from midpoint voltage to avoid distortion.

FIG. 6 illustrates this principle. FIG. 6 illustrates time domain waveforms illustrating the respective output signals SoutP and SoutN corresponding to the same input signal sine wave as FIG. 5. In the example of FIG. 6, however, the common-mode component of the driving signals SoutP and SoutN has been selectively varied, in this case increased to a level around 0.75 (in terms of the normalised output voltage). In other words the driving signals SoutP and SoutN have both been generated with a DC offset added to vary the common-mode level away from the midpoint voltage Vmid. The driving signals SoutP and SoutN vary around this common-mode voltage level, which is selected to allow sufficient headroom for the relevant signal amplitude. In this example the driving signals SoutP and SoutN can be generated with signal levels that avoid the operating region which results in zero crossing distortion, e.g. the voltage region around the midpoint voltage. As such, both the driving signals SoutP and SoutN may thus significantly avoid the zero crossing distortion that occurs in the example of FIG. 5. As the same common-mode modulation has been made to both driving signals, the common-mode component does not appear in the differential signal Sdiff across the load, but the resultant differential signal Sdiff does not suffer from the distortion seen in the example of FIG. 5.

Figure 3A:
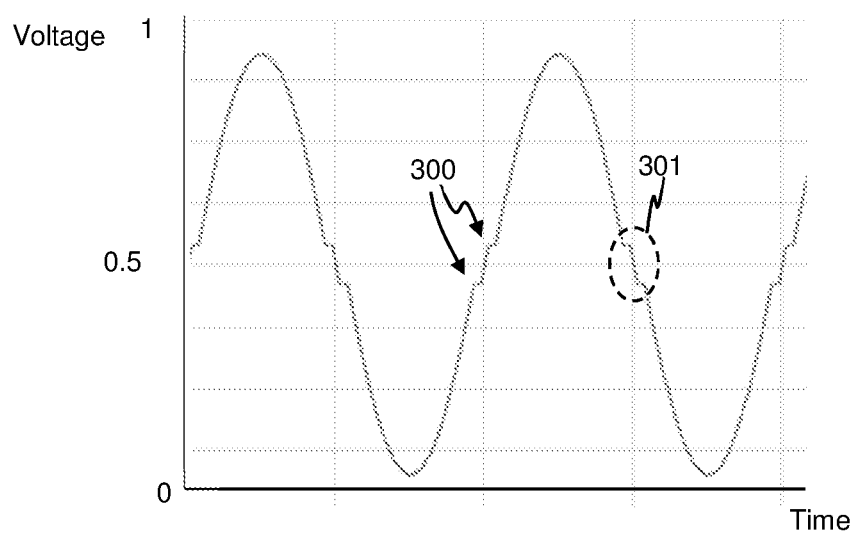
FIG. 3a illustrates one example of a waveform of an amplifier output and FIG. 3b illustrates one example of a transfer characteristic of an amplifier with dead time or zero crossing distortion.
Figure 3B:
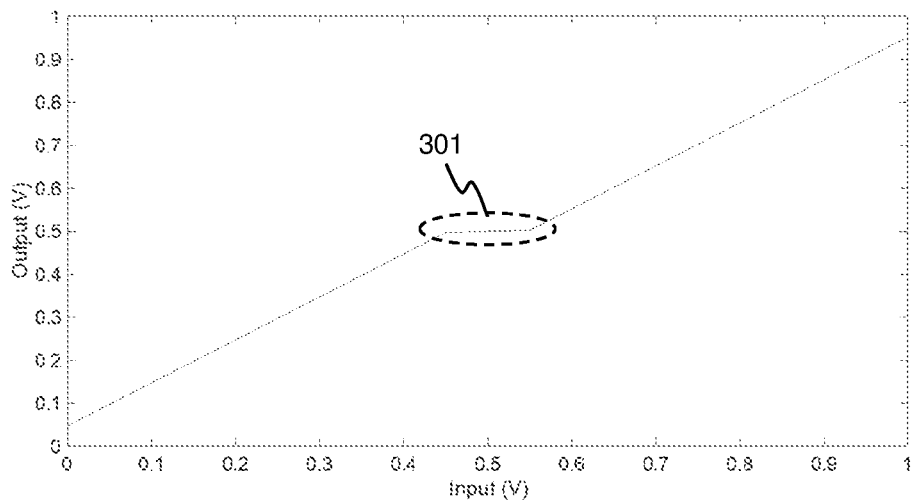

If the output stages 403p and 403n experience distortion such as illustrated in FIG. 3a and/or have a transfer characteristic such as illustrated in FIG. 3b, a common-mode component, i.e. a DC offset, may be introduced so that both output stages operate, where possible, to avoid the region 301 of zero crossing distortion, and instead operate in a region of substantially consistent, e.g. linear, transfer characteristic. For the example waveforms of FIG. 6, the common-mode voltage is increased so that both output stages 403p and 403n operate in the substantially linear region corresponding to higher output voltages, e.g. the upper-right part of the plot of FIG. 3b, but equally the common-mode component could have been reduced to operate in the substantially linear region corresponding to lower output voltages, e.g. the lower-left part of the plot of FIG. 3b.

It will be understood that generating the relevant driving signal SoutP or SoutN in a voltage range of the amplifier that avoids region 301, i.e. operating purely within one of the regions of consistent (in this case substantially linear) transfer characteristic, requires the common-mode component voltage of the driving signals to be moved away from this region by an amount greater than the signal amplitude— whilst to avoid clipping there should still be sufficient headroom above (or below as appropriate) the selected common-mode level for that signal amplitude. It will be understood that this is only be possible for output signals with a magnitude of less than half the maximum amplitude.

In the example of FIG. 3b, the operating region 301 extends for an input signal in the normalised range of about 0.45-0.55V, so for signal amplitudes of up to about 0.2V, it would be possible to operate purely in one of the operating regions above or below the region 301, by varying the common mode voltage component by an amount slightly greater than 0.2V, e.g. generating each driving signal SoutP and SoutN with an effective common-mode voltage of 0.75V or so.

Figure 7:
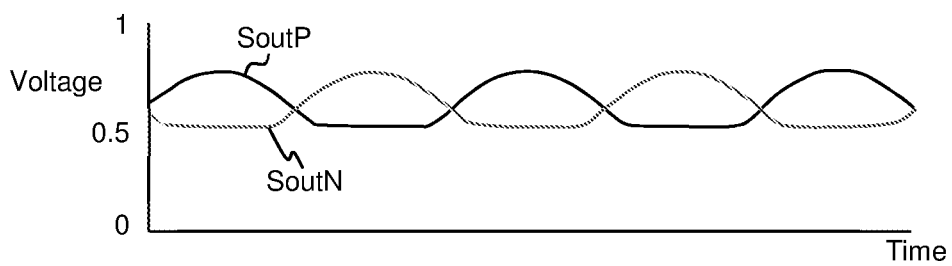
FIG. 7 illustrates output waveforms similar to FIG. 5 but with a common-mode varied from midpoint voltage to partially reduce distortion.

If the common-mode voltage component of the output driving signal were adjusted by less than the amplitude of the required output signal, then at least part of the output signal waveform may be distorted by zero crossing distortion. FIG. 7 illustrates an example of output driving waveforms SoutP and SoutN, for a sine wave input, where the common-mode component of the driving signals has been increased from the normal midpoint voltage level, but by an amount less than the amplitude of the driving signals. It can be seen that part of each of the driving waveforms is within the operating region that experiences zero crossing distortion, and as such the driving signals are distorted. However, the overall distortion characteristic is still improved compared to the example of FIG. 5, with no variation of the component mode component of these driving signals.

For larger output signal amplitudes, e.g. with an amplitude which is half the maximum amplitude or greater, it thus may not be possible to operate completely outside of region 301 (without clipping) but there may still be some distortion improvements if the common-mode of the driving signals SoutP and SoutN are adjusted so that a greater proportion of the relevant driving waveform occurs with an operating region of the relevant amplifier output stage that exhibits a consistent, e.g. linear, transfer characteristic.

For relatively high amplitude output signals, e.g. at or near maximum output amplitude, it may not be possible to move the common-mode level of the driving signals by any significant amount without signal clipping and/or there may be limited or no benefit from a small variation in the common-mode level of such driving signals. Such high amplitudes may, however, only occur relatively rarely in use in some applications and, in any case, the impact of the distortion may be lower for such high amplitude driving signals.

In general then, embodiments of the invention thus vary the common-mode component of the driving signals, when possible, to reduce distortion. The common-mode component of the first and second driving signals may be varied, so that, for lower amplitudes, the common-mode component corresponds to a signal level that is further away from an output signal range of the first and second output stages that experiences zero crossing distortion, than for higher amplitudes.

The amount of variation of the common-mode of the driving signals may depend on the amplitude of the driving signals. For amplitudes below a first, relatively low, threshold it may be possible to move the common-mode level of the driving signal enough so that the driving signals may be generated in a voltage range that avoids a region of zero cross distortion. Thus, for first and second driving signals below a first amplitude threshold, the common-mode may be controlled so that first and second driving signals are generated in a range of signal levels that is outside an output signal range of the output stages that experiences zero crossing distortion. As mentioned for the example transfer characteristic of FIG. 3, the first threshold would be lower than half the maximum amplitude. Above a second, higher threshold it may not be possible to move the common-mode level significantly without a risk of clipping, or there may be limited benefit to moving the common-mode voltage. For amplitudes above the second threshold the variable offset may be reduced to zero. For amplitudes between these thresholds there may be some benefit in applying some variation to the common-mode component so as to reduce distortion.

Referring back to FIG. 4, the amplifier circuit 400 according to an embodiment thus has controller 406 to selectively control a common-mode level of the output driving signals SoutP and SoutN. The controller 406 is configured to generate a control signal CM to controllably vary or modulate the common-mode component of the driving signals SoutP and SoutN based on an indication of the amplitude of the signal being amplified. In some embodiments the control signal CM may be an indication of the target common-mode level of the output driving signals, e.g. a common-mode reference signal that defines the common-mode level. In some embodiments the control signal CM may instead be an indication of the extent of any modulation of the common-mode level, e.g. an indication of the amount of offset required.

In some embodiments the controller 406 may receive an indication AMP of the amplitude of the input signal from some upstream component, which may determine the amplitude for some other reason. Such a received indication AMP of the amplitude of the input signal may be used to set an appropriate target common-mode level. In some embodiments the controller 406 may additionally or alternatively receive an indication of a variable gain being applied to the signal being amplified, e.g. an indication VOL of a user or system controlled volume and take such gain into account. In some examples the indication of volume could be used, on its own as an indication of signal amplitude, as the volume setting may indicate the maximum amplitude of the driving signals.

In some implementations, however, the controller 406 may be configured to monitor the input signal Sin to determine an indication of the amplitude of the input signal—which thus provides an indication of the amplitude of the driving signal will be. As illustrated the controller 406 may thus, in some embodiments, receive an version of the input signal and determine a measure of amplitude of this monitored signal. The controller 406 may operate on an analogue version of the input signal Sin, but conveniently the controller 406 operates on a digital version of the input signal.

Figure 8:
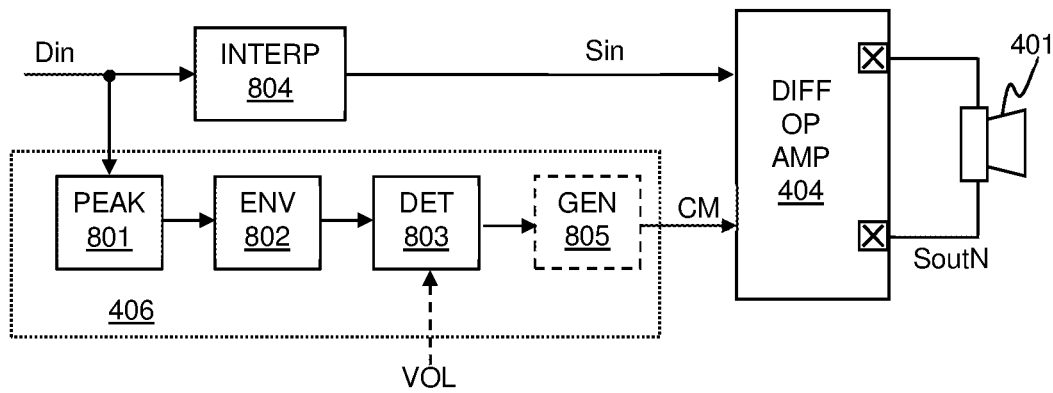
FIG. 8 illustrates one example of controller for controlling the common-mode component of the driving signal from a differential-output amplifier.

FIG. 8 illustrates one example of possible controller 406. FIG. 8 illustrates the controller 406 may monitor a digital version Din of the input signal at an appropriate point of the signal path to differential-output amplifier 404. In this example the controller 406 may monitor the digital input signal Din with an enveloped detector that includes a peak detector 801 to determine the peak absolute magnitude values of the input signal as it varies. The indication of the peak absolute magnitude could be used directly as an indication of the signal amplitude or envelope, but in the example of a FIG. 8 an envelope tracker 802 may be used to track the envelope or amplitude value of the input signal. The envelope tracker 802 may have a fast attack time constant to respond rapidly to any increases in signal amplitude, but may have a slower decay time constant so as to avoid rapid variations in envelope level.

It will be understood that envelope trackers and the like are used to determine input signal amplitude in other applications, for instance for control over supply voltages in class G amplifiers, or for gain control for dynamic range extension for ADCs and DACs. Any of the signal monitoring techniques or apparatus used for such other applications could be employed in embodiments of the present disclosure to monitor the input signal and the amplitude thereof.

The tracked envelope value from envelope tracker 802 may be used, by a determination module 803 to determine an appropriate value of the common-mode voltage level, or modulation thereto, for the differential-output amplifier 404. The determination module 803 may, for instance, comprise a stored set of target common-mode values for different values or thresholds of amplitude level, e.g. a suitable look-up table or the like, or the determination module 803 may calculate a suitable target common-mode voltage level based on the envelope value according to a predefined formula. In some examples, the controller 406 may additionally take into account any variable gain that may be applied downstream of where the input signal Din is monitored, e.g. an indication VOL of any user or system controlled volume control in determining the appropriate level of the common-mode of the differential amplifier.

The controller 406 may be configured to make any changes to the common-mode level in a relatively smooth manner, i.e. to avoid any significant step changes or very rapid changes to the common-mode level. Whilst ideally the modulation of the common-mode component of the driving signals SoutP and SoutN is of the same magnitude and occurs at the same time, i.e. the same DC offset is effectively applied to the driving signals at the same time, in practice various mismatches in the amplifier circuitry and output to the load could result in a sudden variation in the DC offset of each driving signal appearing, at last partly, at a differential component across the load. Advantageously, therefore, the controller 406 may be configured to vary the common-mode level in a relatively smooth or continuous manner and within a set maximum rate of change. The determination module 803 may therefore be configured such the output common-mode control signal CM varies the common-mode level, or DC offset, in a relatively smooth manner.

To allow the controller 406 time to determine the amplitude level of the input signal and an appropriate target common-mode voltage, the controller 406 may be implemented as part of a look-ahead arrangement. This may especially allow time for the amplifier circuit to transition to the appropriate common-mode level, particularly in response to any increases in signal amplitude where the common-mode level may need to be varied to avoid signal clipping. The controller 406 may thus be configured to monitor the digital input signal Din before some element in the signal path with a signal path propagation delay or latency. FIG. 8 illustrates that the controller 406 may monitor the digital input signal prior to an interpolator 804 in the signal path. As will be understood by one skilled in the art a digital input signal may be interpolated to a higher sample rate signal prior to the amplifier 404 and the interpolation will introduce some latency in the signal path. By monitoring the digital signal prior to interpolation the controller 406 may exploit some inherent delays in the main signal path to provide at least part of a look ahead. An interpolator is just one example however and there may be additional and/or alternative delay elements in the signal path, which could include dedicated delay elements that are present only to provide a suitable propagation delay.

Referring back to FIG. 4, the controller 406 may control the common-mode level of the driving signals SoutP and SoutN in a number of different ways. As noted above the common-mode modulation is effectively a DC offset which is added to both driving signals. In some examples the controller 406 may generate a control signal CM to control the amount of an offset applied to each of the differential signal paths prior to the output stages 403p and 403n. The offset which is added to each path is the same, and thus becomes a common mode component of the differential inputs to the output stages 403p and 403n, and hence to the driving signals SoutP and SoutN. Depending on the implementation the offset could be controllable applied, at least partly, as an analogue offset to an analogue part of the signal paths or at least partly, as a digital offset to a digital part of the signal paths. Additionally or alternatively the controller 406 may generate a control signal CM to control the operation of the output stages 403p and 403n to control the common-mode voltage.

Figure 9:
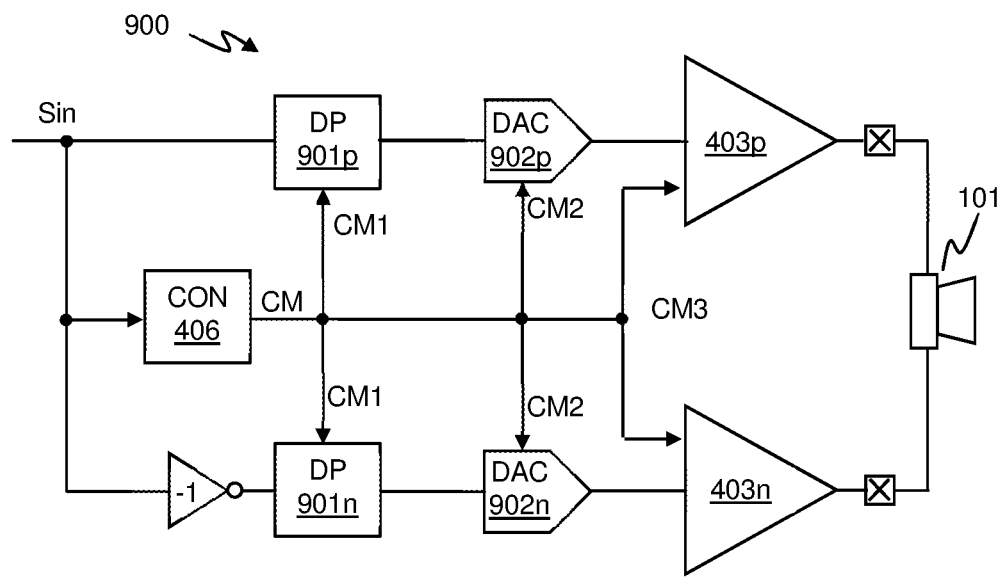
FIG. 9 illustrates examples of how a controller may vary the common-mode component of the driving signal from a differential-output amplifier.

FIG. 9 illustrates an amplifier circuit 900 for driving a bridge-tied-load and illustrates some of the ways in which the common-mode component of the driving signals SoutP and SoutN may be controlled.

As mentioned, the common-mode component could be controlled by the controller 406 by selectively controlling a digital offset applied in a digital part of the differential signal paths. FIG. 9 illustrates the signal paths for the output stages 403p and 403n may each comprise a respective digital processing module 901p and 901n, which may be operable to selectively vary the amount of an offset applied to the digital signal in response to control signals CM1 from the controller. The digital processing modules 901p and 901n may, in some embodiments, simply comprise a digital adder for adding a digital offset value represents by the control signals CM1. However, in some implementations the digital processing modules 901p and 901n may comprise some digital modulator for modulating the digital signal into a form for downstream processing.

The common-mode component could be controlled by the controller 406 by selectively controlling an offset applied in an analogue part of the differential signal paths. FIG. 9 illustrates the signal paths for the output stages 403p and 403n may each comprise a respective digital-to-analogue converter (DAC) 902p and 902n. Some amplifier implementations may include a DAC, such as a sigma-delta modulator, to generate analogue signals for input to the class D output stages 403p and 403n. In some implementations a variable analogue offset may be controllably applied to the output of the DACs 902p and 902n, for instance by varying a voltage on an offset capacitor in response to a control signal CM2 from the controller. In general however it may be preferred to apply any offset in the digital domain rather than the analogue domain.

It should be noted that where the signal paths for the output stages 403p and 403n do include sigma-delta modulators, e.g. as part of DACs 902p and 902n, then any significant out-of-band quantisation noise arising from the sigma-delta modulator which is present in the output signal may potentially interact with components in the output signal due to any zero-crossing distortion. This may potentially result in mixing of the signal components which may result in undesired noise in the signal band of interest. Modulating the common mode level of the output signal so as to reduce the amount of zero-crossing distortion in the output signal will also reduce the amount of such mixing and thus improve noise performance.

The common-mode level of the driving signals may also be controlled by controlling operation of the output stages 403p and 403n by a control signal CM3 from the controller 406.

In some embodiments the common-mode level of the driving signals SoutP and SoutN may be controlled by controlling a reference voltage which is used to define the common-mode. In this case the control signal CM3 may be a reference voltage and thus, referring back to the FIG. 8, the controller 406 may optionally comprise a voltage generator 805 for generating a suitable reference voltage.

The voltage generator may comprise any suitable type of voltage generator. For example the voltage generator could comprise a voltage DAC, e.g. a resistor string DAC or switched capacitor DAC as would be understood by one skilled in the art. In some example a current DAC could drive a controlled current into a defined resistance. In some implementation a voltage reference, e.g. a bandgap reference of the like, could be amplified by a programmable gain amplifier to provide the desired voltage.

Figure 10:
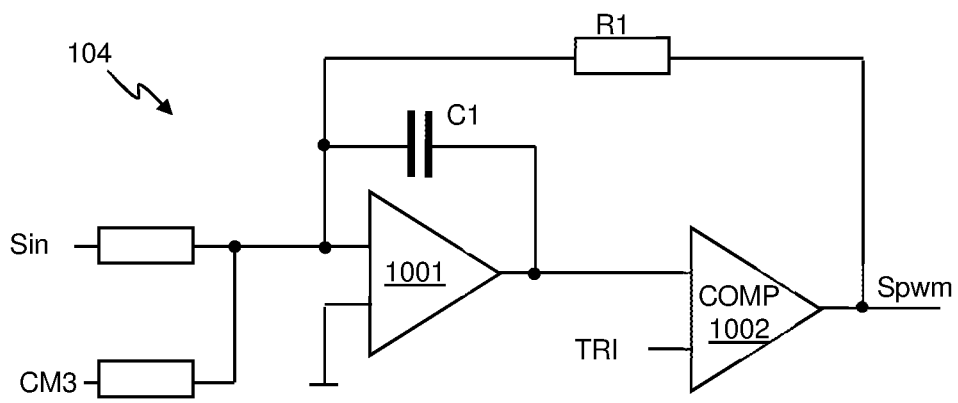
FIG. 10 illustrates one example of a PWM modulator for generating one of the driving signals with a variable common-mode component.

Such a common-mode reference voltage could be used to set the common-mode voltage of a class D amplifier in a number of ways, as would be understood by one skilled in the art. For example for a pseudo-differential arrangement with separate PWM modulators in the output stages 403p and 403n, the common-mode reference voltage could be used to define one of the voltages of the PWM modulator. FIG. 10 illustrates one example of a PWM modulator 104 as could be used for the output stages 403p and 403n. In this example the relevant input signal Sin for the output stage is combined with a feedback signal from the PWM modulator output and filtered, in this case integrated by the integrator formed by op-amp 1001 and capacitor C1. The integrated signal is compared to a time-varying reference waveform, in this example, a triangle waveform to generate the PWM signal Spwm. As illustrated in FIG. 1 the common-mode reference voltage CM3 could be added to the input to the PWM modulator to define the common-mode voltage. The input signal may, in that case, have a quiescent level corresponding to ground. Alternatively the signal CM3 could define the amount of offset to the common-mode voltage. Equally however the common-mode voltage could be applied to other parts of the PWM modulator, e.g. to the triangle waveform TRI.

A fully differential amplifier will, as will be understood by one skilled in the art, have a common-mode that may be defined by the reference.

Some embodiments of the present disclosure thus relate to class-D amplifier circuitry for generating first and second driving signals for driving a bridge-tide-load, in which a common-mode component of the first and second driving signals is controllably varied, in use, based on an indication of signal amplitude. The common-mode component is controlled so as to reduce distortion of the driving signals, in particular to reduce zero crossing distortion. The common-mode component may be controllably varied so that the driving signals are generated in an output signal range which is moved, at least partly, away from an operating range which experiences zero cross distortion.

The description above has described examples relating to class D amplifier circuits, which suffer from zero-cross distortion, in the case of the amplifier current reaching zero. Some other amplifier types, e.g. class A amplifiers, also experience crossover distortion which occurs at certain output signal levels, typically to do with crossing from a positive part of a waveform to an negative part of a waveform. Whilst the exact cause of the crossover distortion may be different, the principle of distortion that occurs at low signal levels is the same. The principles of the present disclosure and the techniques described herein are thus applicable to any type of amplifier circuit with first and second driving stages for driving first and second output signals to a bridge-tied load.

Some embodiments of the present disclosure thus relate to amplifier circuitry for generating first and second driving signals for driving a bridge-tide-load, in which a controllable offset may be applied to both driving signals. The offset may be applied so as to move a common-mode component of the driving signals away from an output signal range that experiences zero crossing distortion.

Embodiments may be advantageously implemented as part of audio driving circuitry, e.g. for audio amplifiers for providing audio driving signals to audio output transducers such as loudspeakers, which may be transducers of a host device and/or transducers of an accessory apparatus which may be removably connected to the host device in use.

Embodiments may be arranged as part of an audio and/or signal processing circuit, for instance an audio circuit such as a codec which may be provided in a host device. A circuit according to an embodiment of the present invention may be implemented as an integrated circuit.

Embodiments may be incorporated in a host electronic device, which may for example be a portable device and/or a device operable with battery power. The host device could be a device with one or more loudspeaker provided as part of the host device and/or a connector for making a wired connection with a loudspeaker of a removable accessory apparatus that may be removably connected to the host device in use. The host device may include a wireless communication module for receiving input data. The host device could be a communication device such as a mobile telephone or smartphone or similar, a computing device such as notebook, laptop or tablet computing device, a wearable device such as a smartwatch. The host device could alternatively be an accessory device for use with any such communication, computing or wearable device.

The skilled person will recognise that some aspects of the above-described apparatus and methods, may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Amplifier circuitry for receiving an input signal and generating first and second driving signals for driving a bridge-tied-load, the amplifier circuitry comprising:
   first and second class-D output stages for generating the first and second driving signals based on the input signal; and
   a controller configured to controllably vary a common-mode component of the first and second driving signals based on an indication of amplitude of the first and second driving signals, so that, for lower amplitudes of the first and second driving signals, said common-mode component corresponds to a signal level that is further away from an output signal range of the first and second output stages that experiences zero crossing distortion, than for higher amplitudes of the first and second driving signals.

2. The amplifier circuitry of claim 1 wherein the controller is configured to vary the common-mode component of the first and second driving signals so that, for first and second driving signals below a first amplitude threshold, the first and second driving signals are generated in a range of signal levels that is outside an output signal range of the first and second class-D output stages that experiences zero crossing distortion.

3. The amplifier circuitry of claim 1 wherein the controller is configured to monitor the input signal to provide said indication of amplitude of the first and second driving signals.

4. The amplifier circuitry of claim 3 wherein the controller comprises an envelope detector to determine an amplitude envelope value of the input signal.

5. The amplifier circuitry of claim 3 wherein the controller is configured to monitor the input signal upstream of an element which provides some signal path propagation delay.

6. The amplifier circuitry of claim 1 wherein the controller is configured to control operation of the first and second class-D output stages to vary a common-mode component of the first and second driving signals.

7. The amplifier circuitry of claim 6 wherein each of the first and second class-D output stages comprises a respective PWM modulator for receiving a respective differential signal based on the input signal and the controller is configured to controllably vary a reference voltage combined with the relevant differential signal input to the PWM modulator.

8. The amplifier circuitry of claim 1 wherein the controller is configured to vary a common-mode component of the first and second driving signals by varying a voltage reference used by the amplifier circuitry to define a common-mode voltage for the first and second driving signals.

9. The amplifier circuitry of claim 8 wherein the controller is configured to control a voltage generator to generate the voltage reference, and wherein the voltage generator comprises one of:
   a voltage digital-to-analogue converter;
   a current digital-to-analogue converter for driving current through a defined resistance;
   a programmable gain element for applying a controlled gain to a defined voltage.

10. The amplifier circuitry of claim 1 wherein the controller is configured to controllably vary the common-mode component of the first and second driving signals so that the rate of change of the common-mode component does not exceed a predefined maximum.

11. The amplifier circuitry of claim 1 configured to receive an audio signal as the input signal and to generate the first and second driving signals for driving an audio output transducer.

12. The amplifier circuitry of claim 1 implemented as an integrated circuit.

13. An electronic device comprising the amplifier circuitry of claim 1.

14. Amplifier circuitry for receiving an input signal and generating first and second driving signals for driving a bridge-tied-load, the amplifier circuitry comprising:
   first and second class-D output stages for generating the first and second driving signals based on the input signal;
   a controller configured to controllably vary a common-mode component of the first and second driving signals based on an indication of amplitude of the first and second driving signals; and
   first and second signal paths for supplying differential signals based on the input signal to the first and second class-D output stages respectively;
   wherein the controller is configured to controllably vary the common-mode component of the first and second driving signals by controlling the amount of an offset applied to both the first and second signal paths; and
   wherein the first and second signal paths comprise respective first and second digital processing elements operable to add a digital offset to digital signals in the respective signal path and wherein the controller is configured to control the digital offset applied by the first and second digital processing elements.

15. The amplifier circuitry of claim 14 wherein the first and second signal paths comprise respective first and second digital-to-analogue converters and wherein the controller is configured to control an analogue offset applied by the first and second digital-to-analogue converters.

16. Amplifier circuitry comprising:
   first and second output stages for generating first and second differential driving signals based on an input signal; and
   a controller configured to controllably vary a common-mode component of the first and second differential driving signals depending on the amplitude of the input signal, that, for lower amplitudes of the input signal, said common-mode component corresponds to a signal level that is further away from an output signal range that experiences distortion, than for higher amplitudes of the first and second differential driving signals.

17. Amplifier circuitry comprising:
   a differential class D output stage for generating first and second differential driving signals based on an input signal; and a controller configured to control a common-mode component of the first and second differential driving signals so that for lower amplitudes of the first and second driving signals, said common-mode component corresponds to a signal level that is further away from an output signal range of the differential class D output stage that experiences zero crossing distortion, than for higher amplitudes of the first and second driving signals.

* * * * *

UNITED STATES PATENT AND TRADEMARK OFFICE
CERTIFICATE OF CORRECTION

PATENT NO. : 11,418,153 B2
APPLICATION NO. : 16/897847
DATED : August 16, 2022
INVENTOR(S) : Lesso et al.

It is certified that error appears in the above-identified patent and that said Letters Patent is hereby corrected as shown below:

In the Claims

1. In Column 15, Line 31, in Claim 1, delete "second" and insert -- second class-D --, therefor.

2. In Column 16, Line 59, in Claim 16, delete "that," and insert -- so that, --, therefor.

Signed and Sealed this
Sixteenth Day of May, 2023

Katherine Kelly Vidal
*Director of the United States Patent and Trademark Office*